United States Patent
Hong et al.

(10) Patent No.: US 11,433,368 B2
(45) Date of Patent: Sep. 6, 2022

(54) METHOD AND APPARATUS OF PREPARING CATALYST FOR FUEL CELL

(71) Applicants: Hyundai Motor Company, Seoul (KR); KIA MOTORS CORPORATION, Seoul (KR); PUSAN NATIONAL UNIVERSITY INDUSTRY-UNIVERSITY COOPERATION FOUNDATION, Busan (KR)

(72) Inventors: Woong Pyo Hong, Yongin-si (KR); Se Hun Kwon, Busan (KR); Woo Jae Lee, Busan (KR)

(73) Assignees: HYUNDAI MOTOR COMPANY, Seoul (KR); KIA MOTORS CORPORATION, Seoul (KR); PUSAN NATIONAL UNIVERSITY INDUSTRY-UNIVERSITY COOPERATION FOUNDATION, Busan (KR)

( * ) Notice: Subject to any disclaimer, the term of this patent is extended or adjusted under 35 U.S.C. 154(b) by 51 days.

(21) Appl. No.: 16/679,718

(22) Filed: Nov. 11, 2019

(65) Prior Publication Data
US 2020/0179893 A1 Jun. 11, 2020

(30) Foreign Application Priority Data
Dec. 7, 2018 (KR) .................. 10-2018-0157501

(51) Int. Cl.
*B01J 23/42* (2006.01)
*B01J 31/12* (2006.01)
(Continued)

(52) U.S. Cl.
CPC ............. *B01J 8/388* (2013.01); *B01J 8/40* (2013.01); *B01J 23/40* (2013.01); *B01J 23/42* (2013.01);
(Continued)

(58) Field of Classification Search
CPC ............ H01M 4/9075; H01M 4/9083; H01M 4/921; H01M 4/926; B01J 8/40
See application file for complete search history.

(56) References Cited

U.S. PATENT DOCUMENTS

2004/0235650 A1* 11/2004 Saleh .................. B01J 37/0232
502/258
2006/0086834 A1* 4/2006 Pfeffer .................. B01J 8/1872
241/5
2011/0008707 A1* 1/2011 Muraoka ............. H01M 8/1013
429/483
(Continued)

FOREIGN PATENT DOCUMENTS

CN 105406087 A * 3/2016 ............ H01M 4/886
KR 10-1592739 B1 2/2016

OTHER PUBLICATIONS

O'Neill et al (Catalyst Design with Atomic Layer Deposition, ACS Catal., 2015, 5, 1804-1825).*
(Continued)

*Primary Examiner* — Jun Li
(74) *Attorney, Agent, or Firm* — Morgan, Lewis & Bockius LLP (57) ABSTRACT

A method for producing a catalyst for a fuel cell comprising: a) injecting carbon particles into a fluidized bed reactor; b) evacuating the fluidized bed reactor to form a base pressure; c) introducing a catalytic metal precursor together with a carrier gas into the fluidized bed reactor to contact the catalytic metal precursor with the carbon particles; d d) purging a purge gas into the fluidized bed reactor; e) (Continued)

introducing a reaction gas into the fluidized bed reactor to attach the catalytic metal precursor to the carbon particles; and f) purging a purge gas into the fluidized bed reactor, wherein, the catalytic metal is attached to the carbon particles in a form of nano-sized spot.

14 Claims, 8 Drawing Sheets

(51) Int. Cl.

| | |
|---|---|
| *B01J 8/40* | (2006.01) |
| *B01J 8/38* | (2006.01) |
| *B01J 37/02* | (2006.01) |
| *B01J 23/40* | (2006.01) |
| *B01J 23/48* | (2006.01) |
| *B01J 23/74* | (2006.01) |
| *B01J 23/72* | (2006.01) |
| *B01J 37/08* | (2006.01) |
| *B01J 37/34* | (2006.01) |
| *H01M 4/90* | (2006.01) |
| *H01M 4/92* | (2006.01) |
| *H01M 4/94* | (2006.01) |
| *B01J 21/18* | (2006.01) |

(52) U.S. Cl.
CPC ............... *B01J 23/48* (2013.01); *B01J 23/72* (2013.01); *B01J 23/74* (2013.01); *B01J 31/122* (2013.01); *B01J 37/02* (2013.01); *B01J 37/086* (2013.01); *B01J 37/349* (2013.01); *H01M 4/9083* (2013.01); *H01M 4/921* (2013.01); *H01M 4/926* (2013.01); *H01M 4/94* (2013.01); *B01J 21/18* (2013.01); *B01J 2208/00539* (2013.01)

(56) References Cited

U.S. PATENT DOCUMENTS

2011/0198756 A1* 8/2011 Thenappan ............. C07F 17/02
257/E21.294
2012/0201860 A1* 8/2012 Weimer ............... B01J 35/0006
977/890
2019/0109330 A1* 4/2019 Shirvanian ............ H01M 4/925

OTHER PUBLICATIONS

Didden (Fluidized Bed Atomic Layer Deposition Reactor for the Synthesis of Core-shell Nanoparticles, Review of Scientific Instruments 85, 013905 (2014)).*

* cited by examiner

✓ Pt weight percentage depending on the number of cycle
  With increasing the ALD-cycle, Pt weight on C increased linearly
  ➡ Pt deposition control by Atomic layer deposition mode

METHOD AND APPARATUS OF PREPARING CATALYST FOR FUEL CELL

CROSS-REFERENCE OF RELATED APPLICATION(S)

This application claims the benefit of Korean Application No. 10-2018-0157501, filed on Dec. 7, 2018, the entire disclosure of which application is incorporated by reference herein.

TECHNICAL FIELD

The present disclosure relates to a catalyst production method and a production apparatus for a fuel cell. More specifically, the present disclosure relates to a method and apparatus for producing a catalyst for a fuel cell using a fluidized bed reactor.

PRIOR ART

In addition to the electrode material of the fuel cell, the catalyst is also continuously improving performance, and the proposed catalyst includes carbon black as a support and platinum spots are incorporated therein. Platinum is a very expensive metal and uses as little as possible but maximizes the surface area. Therefore, it is desirable to have a form where the platinum spot is small, uniform and active even with the same amount of platinum. Conventionally, such a catalyst is manufactured by a wet process as an example.

In conventional wet processes, the mass production process takes almost a week. In addition, due to the use of chemicals, manufacturing costs are high due to environmental problems, post-treatment, and stabilizer input due to the disposal of chemicals. In addition, the size of the platinum spot incorporated in the carbon black support varies from small to large agglomerates. At this time, large sized platinum spots are undesirable because they counteract the expansion of the surface area relative to the amount of platinum. In addition, when the size of the platinum spot is not constant, the large aggregated spot grows while absorbing the small size spot by the Ostwald Ripening effect. This results in a problem that the performance of the platinum catalyst is reduced. However, in the conventional wet process as described above, it is almost impossible to control the size of the platinum spot.

A method of preparing a platinum/carbon catalyst for a fuel cell by atomic layer deposition (hereinafter referred to as ALD) has also been attempted. It belongs to a method for producing a catalyst by a dry method, the production time can be shortened compared to the wet method described above. It is also environmentally friendly because there is no waste water discharge by using chemicals. Existing research has been conducted to support the platinum catalyst on the carbon material attached or grown on the flat plate, but this method cannot lead to mass production.

CONTENT OF PRESENT DISCLOSURE

Problem to be Solved

With a small amount of catalytic metal, it is possible to produce a catalyst for a fuel cell having a catalytic metal spot having a small, uniform and large surface area. The present disclosure also provides a method for producing a catalyst for a fuel cell and an apparatus capable of mass production.

Solution of Problem

A method for producing a catalyst for a fuel cell according to an embodiment of the present disclosure, comprising:
a) injecting carbon particles into a fluidized bed reactor; b) evacuating the fluidized bed reactor to form a base pressure; c) introducing a catalytic metal precursor together with a carrier gas into the fluidized bed reactor to contact the catalytic metal precursor with the carbon particles; d) d) purging a purge gas into the fluidized bed reactor; e) introducing a reaction gas into the fluidized bed reactor to attach the catalytic metal precursor to the carbon particles; and f) purging a purge gas into the fluidized bed reactor, wherein, the catalytic metal is attached to the carbon particles in a form of nano-sized spot.

The method can repeat the steps c) to f) several times to grow the catalytic metal spot adhered to the carbon particles.

The step c) is performed for 90 to 150 seconds.

The step d) is performed for 60 to 120 seconds.

The step e) is performed for 60 to 120 seconds.

The step (f) is performed for 60 to 120 seconds.

The steps c) to f) may be to periodically apply vibration to the fluidized bed reactor to remove the adhesion material in the upper mash.

In the step of evacuating the fluidized bed reactor to form a base pressure, the pressure is 0.1 to 0.5 Torr.

An inner temperature of the fluidized bed reactor in steps c) to f) is 200 to 400° C.

The catalytic metal precursor is a precursor selected from the group consisting of Pt, Co, Ru, Pd, Cu, Ni, Ag, Ir, Mo, Fe, W, Au, Rh, and combinations thereof.

The Pt precursor is selected from the group consisting of trimethyl(methacyclopentadienyl)platinum($MeCpPtMe_3$), Platinum(II) acetylacetonate($Pt(acac)_2$), [(1,2,5,6.η).1,5.hexadiene] dimethylpatinum(II)(HDMP), dimethyl(N,N-dimethyl-3-butene-1-amine-N)platinum(DDAP), and combinations thereof.

The Co precursor is selected from the group consisting of Bis(N,N'-di-i-propylacetamidinato)cobalt(II)($Co(iPrNC-MeNiPr)_2$), Bis(cyclopentadienyl)cobalt(II)($CoCp_2$), Cyclopentadienylcobalt dicarbonyl ($CoCp(CO)_2$), Cobalt carbonyl (Dicobalt octacarbonyl) ($Co_2(CO)_8$), and combinations thereof.

The Ru precursor is selected from the group consisting of Bis(cyclopentadienyl)ruthenium($Ru(Cp)_2$), Bis(ethylcyclopentadienyl)ruthenium(II)($Ru(EtCp)_2$), methylcyclopentadienyl ethylcyclopentadienyl ruthenium ((EtCp)Ru(MeCp)), ($Me_3NEtCp$)RuCp, Cyclopentadienyl ethyl (dicarbonyl) Ruthenium($Ru(Cp)(CO)_2Et$), N,N-Dimethyl-1-ruthenocenylethylamine($RuCp(CpCh(Me)(NMe_2))$), Tris(2,2,6,6-tetramethyl-3,5-heptanedionato) ruthenium(III)($Ru(thd)_3$), butylacetamidinato)ruthenium(II) dicarbonyl ($Ru(tBuAMD)_2(CO)_2$), Rudic, Carish, and combinations thereof.

The Pd precursor is selected from the group consisting of Palladium(II) hexafluoroacetylacetonate($Pd(hfac)_2$), Palladium tetra methylheptanedionate($Pd(thd)_2$), palladium-keto-iminato($Pd(keim_2)_2$), and combinations thereof.

The Cu precursor is selected from the group consisting of Copper(I) chloride(CuCl), Copper(II) hexafluoroacetylacetonate hydrate($Cu(hfac)_2$), Copper(II) acetylacetonate($Cu(acac)_2$), Copper bis(2,2,6,6-tetramethyl-3,5-heptanedionate)($Cu(thd)_2$), Bis(dimethylamino-2-propoxy)copper(II) ($Cu(dmap)_2$), Bis(N,N'-di-i-propylacetamidinato)copper(II) ($[Cu(iPrNCMeNiPr)]_2$), Bis(N,N'-di-sec-butylacetamidinato)dicopper(I)($[Cu(sBuNCMeNsBu)]_2$), and combinations thereof.

The Ni precursor is selected from the group consisting of Bis(N,N'-di-i-propylacetamidinato)nickel(II)(Ni(iPrNC-MeNiPr)$_2$), Nickel(II) acetylacetonate(Ni(acac)$_2$), Nickel Heptafluoroisopropyl(Ni(hfip)$_2$), and combinations thereof.

The Ag precursor is selected from the group consisting of (2,2-dimethylpropionato)silver(I)triethylphosphine(Ag(O$_2$CtBu)(PEt$_3$)), (1,5-Cyclooctadiene)(hexafluoroacetylacetonato)silver(I)(Ag(hfac)(cod)), and combinations thereof.

The Ir precursor is selected from the group consisting of Indium(III) acetylacetonate(Ir(acac)$_3$), iridium(ethylcyclopentadienyl)(1,5-cyclooctadiene)(Ir(EtCp)(cod)), 1-Ethyl-cyclopentadienyl-1,3-cyclohexadieneiridium(I)(Ir(MeCp)(chd)), and combinations thereof.

The Mo precursor is MoCl$_5$.

The Fe precursor is Bis(N,N'-di-sec-butylacetamidinato)iron(I)(Fe(iBuNCMeNtBu)$_2$).

The W precursor is WF$_6$.

The carbon particles are selected from the group consisting of carbon black, graphene, carbon nano tubes (CNTs), and combinations thereof.

The reaction gas comprises one selected from O$_2$, O$_3$, Air, H$_2$, NH$_3$, H$_2$ plasma, NH$_3$ plasma, and O$_2$ plasma.

The purge gas is argon gas, helium gas or nitrogen gas.

Before a) the step of injecting carbon particles into the fluidized bed reactor, the method further comprises a step of filling glass beads into an interior part of an upper mesh located at an outlet of the fluidized bed reactor and an outer part of a lower mesh located at the inlet of the fluidized bed reactor.

The purge gas is argon gas, the reaction gas is an oxygen gas, the carbon particles are carbon black, and the metal catalytic precursor is trimethyl(methacyclopentadienyl) platinum (MeCpPtMe$_3$).

An internal pressure of the fluidized bed reactor of steps c) to f) is 1 to 5 Torr.

The purge gas inflow rate is 50 to 200 sccm.

A flow rate of the reaction gas is 10 to 200 sccm.

An apparatus producing a catalyst for fuel cell according to another embodiment of the present disclosure, comprising:

a fluidized bed reactor; a vacuum pump connected to an upper part of the fluidized bed reactor and controlling a pressure inside the fluidized bed reactor; a purge gas reservoir connected to a lower part of the fluidized bed reactor; a reaction gas reservoir connected to a lower part of the fluidized bed reactor; a first pipe connecting the purge gas reservoir and the fluidized bed reactor; a second pipe connecting the reaction gas reservoir and the fluidized bed reactor; and a container connected to the first pipe, the container storing the catalytic metal precursor.

Wherein, the fluidized bed reactor comprises:

an upper mesh located in an outlet of the upper part of the fluidized bed reactor, comprising a hollow portion therein, formed of a mesh material, and including an open form of the upper surface of the upper mesh; an upper glass bead filled in the upper mesh; an upper surface mesh coupled to an upper surface of the upper mesh; a lower mesh disposed at an inlet of the fluidized bed reactor, including a hollow portion therein and formed of a mesh material; and a lower glass bead filled in the lower part of the fluidized bed reactor.

The glass beads are 1 to 3 mm in diameter.

The apparatus further comprises a vibrator attached to the upper mesh and periodically vibrating the upper mesh.

The lower glass bead is filled to a height that is 0.5 to 3 cm higher than the lower mesh height.

A temperature of inside the fluidized bed reactor is 200 to 400° C.

An internal temperature of the first and second pipe is 50 to 150° C.

A temperature of inside the container is 10 to 50° C.

Effect

By using a fluidized bed reactor, a catalyst metal spot having a small and uniform size; and distribution; is formed on the carbon particles, thereby producing a fuel cell catalyst having a large surface area of the catalyst metal.

In addition, using a fluidized bed reactor, mass production of fuel cell catalyst is possible.

Further, by uniformly floating the carbon particles, the catalytic metal precursor, and the reaction gas in the fluidized bed reactor, the carbon particles and the catalytic metal precursor can be more efficiently exposed to the reactant.

DETAILED DESCRIPTION

Hereinafter, embodiments of the present disclosure will be described in detail. However, this is presented as an example, by which the present disclosure is not limited and the present disclosure is defined only by the scope of the claims to be described later.

In this specification, terms such as first, second and third are used to describe various parts, components, regions, layers and/or sections, but are not limited to these. These terms are only used to distinguish one part, component, region, layer or section from another part, component, region, layer or section. Accordingly, the first portion, component, region, layer or section described below may be referred to as the second portion, component, region, layer or section without departing from the scope of the present disclosure.

In this specification, when a part is said to "comprising" a certain component, it means that it may further include other components, except to exclude other components unless otherwise stated.

The terminology used herein is for the purpose of referring only to specific embodiments and is not intended to limit the present disclosure. As used herein, the singular forms "a," "an," and "the" include plural forms as well, unless the phrases clearly indicate the opposite.

As used herein, the term "combinations thereof" included in the expression of the Markush form means one or more mixtures or combinations selected from the group consisting of the elements described in the Markush form representation, it means to include one or more selected from the group consisting of the above components.

Hereinafter, exemplary embodiments of the present disclosure will be described in detail with reference to the accompanying drawings so that those skilled in the art may easily implement the present disclosure. As those skilled in the art would realize, the described embodiments may be modified in various different ways, all without departing from the spirit or scope of the present disclosure.

When a portion of a layer, film, region, plate, or the like is said to be "on" or "above" another portion, this includes not only the case where the other portion is "right on" but also another portion in the middle. In addition, throughout the specification, "on" means to be located above or below the target portion, and does not necessarily mean to be located above the gravity direction.

The present disclosure provides a method and an apparatus for producing a catalyst in which a catalyst metal is incorporated into a carbon support, which can be mass-produced and the catalyst spot can be formed to have a small and uniform size of the platinum spot so as to have a large surface area with a small amount of the catalyst metal.

A Method of Producing Fuel Cell Catalyst

A method for producing a catalyst for a fuel cell according to an embodiment of the present disclosure, comprising:

a) injecting carbon particles into a fluidized bed reactor; b) evacuating the fluidized bed reactor to form a base pressure; c) introducing a catalytic metal precursor together with a carrier gas into the fluidized bed reactor to contact the catalytic metal precursor with the carbon particles; d d) purging a purge gas into the fluidized bed reactor; e) introducing a reaction gas into the fluidized bed reactor to attach the catalytic metal precursor to the carbon particles; and f) purging a purge gas into the fluidized bed reactor, wherein, the catalytic metal is attached to the carbon particles in a form of nano-sized spot.

Specifically, the step (a) of introducing the carbon particles into the fluidized bed reactor can be performed.

Next, a step (step b) of evacuating the fluidized bed reactor to form a base pressure may be performed.

Figure 1:
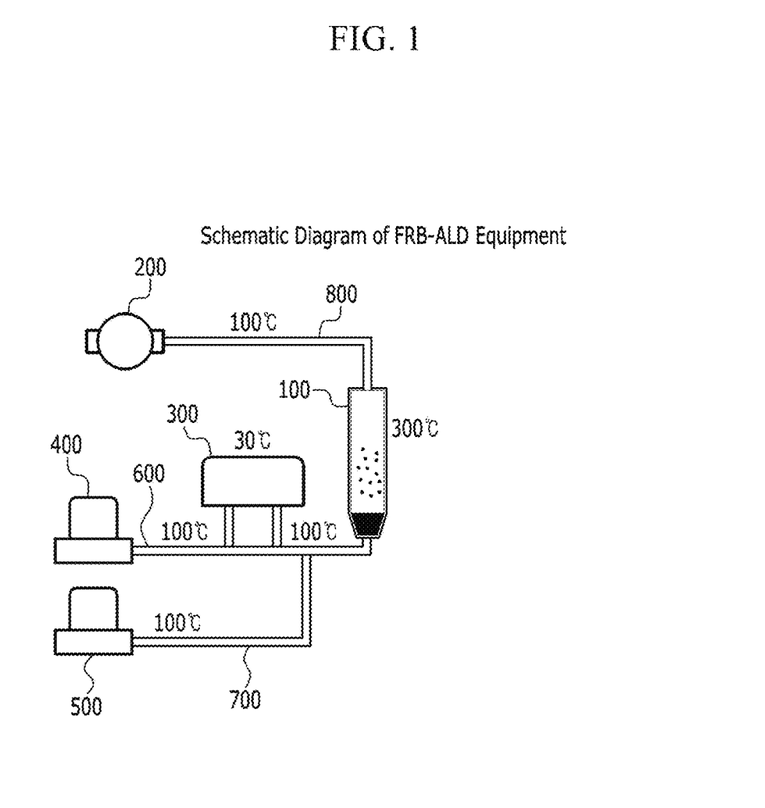
FIG. 1 is a schematic diagram of an apparatus for producing a catalyst for a fuel cell according to an embodiment of the present disclosure.

The pressure inside the fluidized bed reactor 100 may be adjusted to 0.1 to 0.5 Torr using a vacuum pump 200 shown in FIG. 1. Specifically, it may be adjusted to 0.4 Torr. When the base pressure is formed in the fluidized bed reactor, the introduced carbon particles are fluidized and floated. When the pressure range is satisfied, the carbon particles may be effectively fluidized.

Next, the catalytic metal precursor may be introduced into the fluidized bed reactor together with the carrier gas so that the carbon particles and the catalytic metal precursor may be contacted with each other such that the catalyst metal adheres to the carbon particles in a spot form (step c).

The carrier gas serves to move the catalytic metal precursor to the fluidized bed reactor, and a gas that does not react with the catalytic metal precursor may be used. Specifically, argon gas, helium gas, or nitrogen gas may be used.

Contacting the carbon particles with the catalytic metal precursor by introducing the catalytic metal precursor with the purge gas into the fluidized bed reactor may include introducing the catalytic metal precursor with the carrier gas into the fluidized bed reactor at a flow rate of 50 to 200 sccm. It may be to perform 90 to 150 seconds. Specifically, the flow rate may be 50 to 150 sccm. When the above range is satisfied, the catalytic metal precursor and the carbon particles may sufficiently contact.

The carbon particles may be selected from the group containing carbon black, graphene, CNTs, and combinations thereof.

The catalytic metal precursor may be a precursor including a metal selected from the group consisting of Pt, Co, Ru, Pd, Cu, Ni, Ag, Ir, Mo, Fe, W, Au, Rh, and combinations thereof.

The Pt precursor may be selected from the group consisting of trimethyl(methacyclopentadienyl)platinum (MeCpPtMe$_3$), Platinum(II) acetylacetonate(Pt(acac)$_2$), [(1, 2,5,6.η).1,5.hexadiene] dimethylpatinum(II)(HDMP), dimethyl(N,N-dimethyl-3-butene-1-amine-N)platinum (DDAP), and combinations thereof.

The Co precursor may be selected from the group consisting of Bis(N,N'-di-i-propylacetamidinato)cobalt(II)(Co (iPrNCMeNiPr)$_2$), Bis(cyclopentadienyl)cobalt(II)(CoCp$_2$), Cyclopentadienylcobalt dicarbonyl(CoCp(CO)$_2$), Cobalt carbonyl (Dicobalt octacarbonyl) (Co$_2$(CO)$_8$), and combinations thereof.

The Ru precursor may be selected from the group consisting of Bis(cyclopentadienyl)ruthenium(Ru(Cp)$_2$), Bis (ethylcyclopentadienyl)ruthenium(II)(Ru(EtCp)$_2$), methylcyclopentadienyl ethylcyclopentadienyl ruthenium ((EtCp) Ru(MeCp)), (Me$_3$NEtCp)RuCp, Cyclopentadienyl ethyl (dicarbonyl) Ruthenium(Ru(Cp)(CO)$_2$Et), N,N-Dimethyl-1-ruthenocenylethylamine(RuCp(CpCh(Me)(NMe$_2$))), Tris(2, 2,6,6-tetramethyl-3,5-heptanedionato) ruthenium(III)(Ru (thd)$_3$), Bis(N,N-di-t-butylacetamidinato)ruthenium(II) dicarbonyl(Ru(tBuAMD)$_2$(CO)$_2$), Rudic, Carish, and combinations thereof.

The Pd precursor may be selected from the group consisting of Palladium(II) hexafluoroacetylacetonate(Pd (hfac)$_2$), Palladium tetra methylheptanedionate(Pd(thd)$_2$), palladium-ketoiminato(Pd(keim$_2$)$_2$), and combinations thereof.

The Cu precursor may be selected from the group consisting of Copper(I) chloride(CuCl), Copper(II) hexafluoroacetylacetonate hydrate(Cu(hfac)$_2$), Copper(II) acetylacetonate(Cu(acac)$_2$), Copper bis(2,2,6,6-tetramethyl-3,5-heptanedionate)(Cu(thd)$_2$), Bis(dimethylamino-2-propoxy) copper(II)(Cu(dmap)$_2$), Bis(N,N'-di-i-propylacetamidinato) copper(II)([Cu(iPrNCMeNiPr)]$_2$), Bis(N,N'-di-sec-butylacetamidinato)dicopper(I)([Cu(sBuNCMeNsBu)]$_2$), and combinations thereof.

The Ni precursor may be selected from the group consisting of Bis(N,N'-di-i-propylacetamidinato)nickel(II)(Ni (iPrNCMeNiPr)$_2$), Nickel(II) acetylacetonate(Ni(acac)$_2$), Nickel Heptafluoroisopropyl(Ni(hfip)$_2$), and combinations thereof.

The Ag precursor may be selected from the group consisting of (2,2-dimethylpropionato)silver(I)triethylphosphine(Ag(O$_2$CtBu)(PEt$_3$)), (1,5-Cyclooctadiene)(hexafluoroacetylacetonato)silver(I)(Ag(hfac)(cod)), and combinations thereof.

The Ir precursor may be selected from the group consisting of Indium(III) acetylacetonate(Ir(acac)$_3$), iridium(ethylcyclopentadienyl)(1,5-cyclooctadiene)(Ir(EtCp)(cod)), 1-Ethylcyclopentadienyl-1,3-cyclohexadieneiridium(I)(Ir (MeCp)(chd)), and combinations thereof.

The Mo precursor may be MoCl$_5$.

The Fe precursor may be Bis(N,N'-di-sec-butylacetamidinato)iron(I)(Fe(iBuNCMeNtBu)$_2$).

The W precursor may be WF$_6$.

The purge gas may be a gas that does not react with the carbon particles, and a catalytic metal precursor. Specifically, it may be an inert gas such as argon gas, helium, or nitrogen gas.

Next, a step (d) of purging the purge gas into the fluidized bed reactor may be performed. The purging step may be performed by supplying a purge gas at a flow rate of 50 to 200 sccm, and may be performed for 60 to 120 seconds. It may effectively remove residual radicals that do not participate in the reaction when the range is satisfied. Specifically, it may be to supply at a flow rate of 50 to 150 sccm.

Next, a step (e) of attaching the catalytic metal precursor to the carbon particles may be performed by introducing a reaction gas into the fluidized bed reactor to allow the catalytic metal precursor to react with the carbon particles.

The reaction gas can include one selected from $O_2$, $O_3$, Air, $H_2$, $NH_3$, $H_2$ plasma, $NH_3$ plasma, and $O_2$ plasma.

The inflow rate of the reaction gas may be 10 to 200 sccm, and may be performed for 60 to 120 seconds. When the above range is satisfied, the catalytic metal precursor and the carbon particles sufficiently react with the reaction gas, so that the catalytic metal precursor can be effectively attached to the surface of the carbon particles.

Subsequently, a step (step f) of purging the purge gas into the fluidized bed reactor may be performed.

The purge gas inlet rate may be 50 to 200 sccm, and may be purging for 60 to 120 seconds. If the above range is satisfied, the unreacted radicals in the fluidized bed reactor can be effectively removed.

The steps c) to f) may be repeated several times to grow a catalytic metal spot attached to the carbon particles. That is, by controlling the number of cycles of steps c) to f), the size of the catalytic metal spot attached to the carbon particles may be adjusted.

The steps c) to f) may be maintained at 1 to 5 Torr pressure inside the fluidized bed reactor. If the above range is satisfied, the carbon particles can be effectively flown.

During the steps c) to f), the step of periodically applying vibration to the fluidized bed reactor may be performed to remove the adhesion material in the upper mesh. As each step of catalyst preparation is performed, carbon particles or the like may be attached to the upper mesh installed in the fluidized bed reactor outlet. According to one embodiment of the present disclosure, by applying periodic vibrations to the fluidized bed reactor, substances such as carbon particles attached to the upper mesh may be removed, and aggregation between the carbon particles may be prevented. In addition, the carbon particles attached to the upper mesh are fed back to the fluidized bed reactor, thereby contacting the catalytic metal precursor and the reaction gas to improve the catalyst yield.

The internal temperature of the fluidized bed reactor in step c) to f) may be 200 to 400° C. When the temperature range is satisfied, sufficient amount of energy required for the reaction can be provided without decomposition of the catalytic metal precursor and the reaction gas.

Before a) the step of injecting carbon particles into the fluidized bed reactor, the method can further comprise a step of filling glass beads into an interior part of an upper mesh located at an outlet of the fluidized bed reactor and an outer part of a lower mesh located at the inlet of the fluidized bed reactor. The method for preparing a catalyst for a fuel cell according to an embodiment of the present disclosure may include a configuration in which glass beads are filled in an outlet located at an upper portion of a fluidized reactor, and an inlet portion located in a lower portion thereof. In this case, the gas flowing through the inlet and the catalytic metal precursor may be evenly distributed while passing between the glass beads filled in the lower portion of the fluidized bed reactor and uniformly supplied to the fluidized bed reactor.

Hereinafter, a catalyst manufacturing apparatus for a fuel cell according to another embodiment of the present disclosure will be described. The descriptions overlapping with those previously described in the fuel cell catalyst manufacturing method will be omitted.

An Apparatus Producing a Catalyst for Fuel Cell

An apparatus producing a catalyst for fuel cell according to another embodiment of the present disclosure, comprises:

a fluidized bed reactor; a vacuum pump connected to an upper part of the fluidized bed reactor and controlling a pressure inside the fluidized bed reactor; a purge gas reservoir connected to a lower part of the fluidized bed reactor; a reaction gas reservoir connected to a lower part of the fluidized bed reactor; a first pipe connecting the purge gas reservoir and the fluidized bed reactor; a second pipe connecting the reaction gas reservoir and the fluidized bed reactor; and a container connected to the first pipe, the container storing the catalytic metal precursor.

The fluidized bed reactor comprises:

an upper mesh located in an outlet of the upper part of the fluidized bed reactor, comprising a hollow portion therein, formed of a mesh material, and including an open form of the upper surface of the upper mesh; an upper glass bead filled in the upper mesh; an upper surface mesh coupled to an upper surface of the upper mesh; a lower mesh disposed at an inlet of the fluidized bed reactor, including a hollow portion therein and formed of a mesh material; and a lower glass bead filled in the lower part of the fluidized bed reactor.

Figure 2:
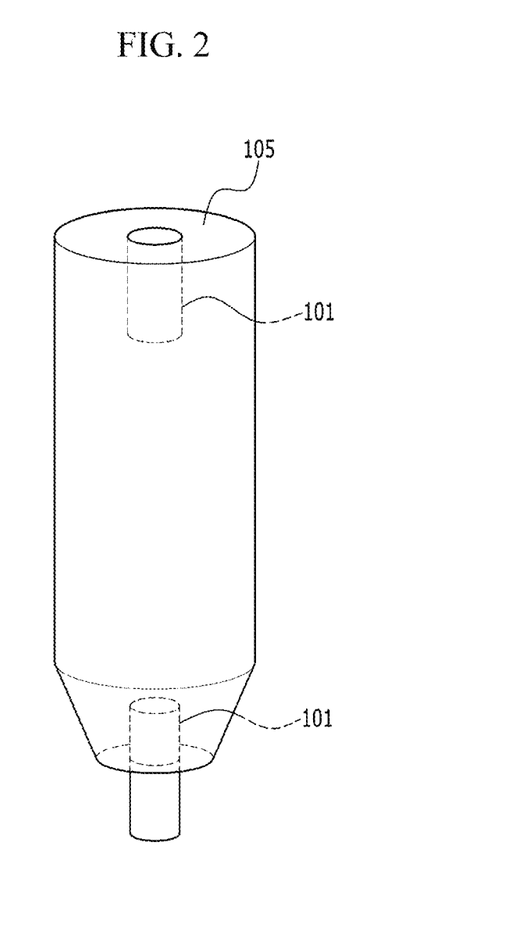
FIG. 2 is a schematic view of a fluidized bed reactor according to one embodiment of the present disclosure.

FIG. 2 shows a fluidized bed reactor according to one embodiment of the present disclosure.

At the bottom of the fluidized bed reactor, an inlet for introducing carbon particles, a catalytic metal precursor, and a gas may be located.

An outlet may be located above the fluidized bed reactor.

Figure 3:
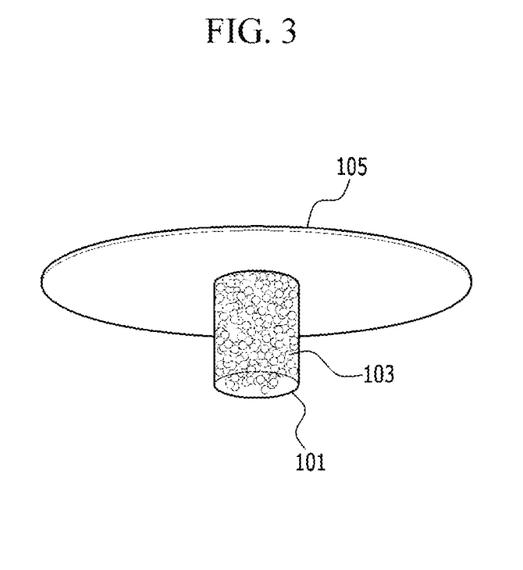
FIG. 3 is a schematic diagram of an upper mesh according to an embodiment of the present disclosure.

FIG. 3 shows the upper mesh, located in the fluidized bed reactor upper outlet, and the upper glass beads filled inside the upper mesh according to an embodiment of the present disclosure.

Figure 4:
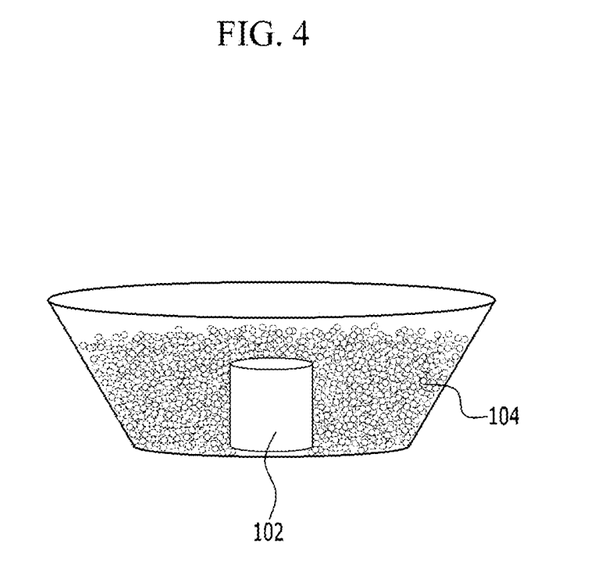
FIG. 4 is a schematic diagram of a lower mesh according to an embodiment of the present disclosure.

FIG. 4 shows the fluidized bed reactor bottom, bottom glass beads and bottom mesh according to an embodiment of the present disclosure.

The fluidized bed reactor includes lower glass beads filled in the lower part of the fluidized bed reactor in which the inlet is located, so that the reaction gas and the catalytic metal precursor supplied into the fluidized bed reactor through the inlet are uniformly dispersed while passing between the lower glass beads to the fluidized bed reactor. The whole area can be supplied uniformly, and the carbon particles can be flowed equally. In addition, by including a lower mesh, it is possible to prevent the lower glass beads from being lost to the inlet.

The fluidized bed reactor may have a form in which the lower portion becomes narrower toward the bottom, and in this case, the gas, the catalytic metal precursor, and the carbon particles introduced through the inlet may be effectively dispersed and introduced.

The upper glass beads and the lower glass beads may be of 1 to 3 mm in diameter.

If the glass bead diameter is too large, the reaction gas and the catalytic metal precursor supplied into the fluidized bed reactor through the inlet may not be sufficiently uniformly dispersed. If the diameter is too small, it may prevent the smooth inflow of the reaction gas and the catalytic metal precursor.

The lower glass bead is filled to a height that is 0.5 to 3 cm higher than the lower mesh height. When the above range is satisfied, the gas flowing into the fluidized bed reactor may be uniformly introduced to the entire reactor area to allow the carbon particles to flow in the same manner. When the filling height of the lower glass beads is too low, the reaction gas and the catalytic metal precursor supplied into the fluidized bed reactor through the inlet cannot be sufficiently evenly dispersed. If the filling height of the glass beads is too high, it may prevent the smooth inflow of the reaction gas and the catalytic metal precursor, and the internal space where the reaction may occur, may be relatively narrowed due to the unnecessarily large amount of filled glass beads.

The upper mesh may be filled with an upper glass bead inside. Specifically, the inside of the upper mesh may be completely filled with the upper glass beads. The upper mesh filled with glass beads lowers the pumping conductance of the vacuum pump, so as to ensure proper fluidity of the carbon black despite the high flow rate of reaction gas.

The upper surface mesh 105 coupled to the upper surface of the upper mesh 103 in open shape of the upper portion prevents the upper glass beads from being lost.

The fluidized bed reactor may further include a vibrator for periodically applying vibration to the fluidized bed reactor. In detail, the vibrator may be attached to the upper mesh and may periodically apply vibration to the upper mesh. As the vibrator proceeds, the adhesion material such as carbon particles attached to the upper mesh is desorbed from the upper mesh and returned to the fluidized bed reactor, thereby suppressing adhesion between the carbon particles and improving the catalyst yield. The vibrator may be to generate a vibration in the range of 10 to 500 Hz. Specifically, it may be 100 to 400 Hz, 200 to 400 Hz, or 250 to 350 Hz. When the above range is satisfied, adhesion between the carbon particles can be effectively suppressed.

The temperature inside the fluidized bed reactor may be 200 to 400° C. When the temperature range is satisfied, sufficient energy for the reaction may be provided without causing decomposition reaction of the catalytic metal precursor and/or the reaction gas.

The internal temperature of the first and second pipes may be 50 to 150° C. When satisfying the above range it can be effectively injected into the reactor by maintaining the evaporation pressure of the catalytic metal precursor.

The temperature inside the container may be 10 to 50° C. When the above range is satisfied, an evaporation pressure may be generated by vaporization of the catalytic metal precursor to effectively move into the reactor. The vacuum pump may further include a third pipe connected to an outlet located above the fluidized bed reactor. The internal temperature of the third pipe may be 50 to 150° C.

In an embodiment of the present disclosure, the purge gas is argon gas, the reaction gas is oxygen gas, the carbon particles are carbon black, and the metal catalytic precursor is $MeCpPtMe_3$.

Hereinafter, preferred examples and comparative examples of the present disclosure are described. However, the following examples are only preferred examples of the present disclosure, and the present disclosure is not limited to the following examples.

Preparation Example (Pretreatment of Support)

In order to apply the atomic layer deposition (ALD) method to the Pt/C catalyst of the present disclosure, a carbon support pretreatment process is required to create a functional group of the carbon support to make a surface capable of smoothly supporting the Pt catalyst.

Citric acid and carbon black were put in the same amount, and distilled water (DI water) was added and then mixed using the ultrasonic wave. In this example, 20 g of citric acid and carbon black, 500 ml of distilled water were added, and ultrasonic stirring was performed for about 1 hour.

The slurry was extracted from the mixture by filtration, washed with distilled water and a filtrate was obtained. The obtained filtrate may be heat treated at 250 to 350° C., for about 30 to 90 minutes. In this example, heat treatment was performed at 300° C., for 60 minutes.

Example

Fluidized bed reactor 100 according to one embodiment of the present disclosure also serves as an ALD process chamber.

After putting the pretreated carbon black particles of the above preparation example into the fluidized bed reactor 100, the pressure inside the fluidized bed reactor 100 was initially 0.4 Torr pumped using the vacuum pump 200.

The internal reaction temperature of the fluidized bed reactor 100 was maintained at 300° C., the temperature of the first and second pipes was 100° C., and the internal temperature of the container 300 storing the platinum catalytic precursor ($MeCpPtMe_3$) was maintained at 30° C.

The argon gas was continuously introduced into the fluidized bed reactor at a flow rate of 100 sccm through the argon gas storage 400 except for the step of introducing the reaction gas during the process. Accordingly, carbon black particles were fluidized and floated in the crucible of the fluidized bed reactor 100. A platinum precursor ($MeCpPtMe_3$) was introduced into the fluidized bed reactor together with argon gas, and the platinum precursor contacts carbon black.

Thereafter, purge gas, for example argon gas, was purged into the reactor 100, and oxygen, which is a reaction gas, was injected to make the platinum spot adhere to the carbon black. Thereafter, argon gas was again injected and purged. Argon gas purging at this stage serves to remove residual radicals that do not participate in the reaction.

In the present embodiment, the operating pressure was maintained at about 3 Torr during the deposition of catalytic metal, and the gas flow rate was 100 sccm for argon and 30 sccm for oxygen. Platinum precursor injection time 120 seconds, argon purging 90 seconds, oxygen injection time 90 seconds, argon purging 90 seconds was set as one unit cycle.

The cycles were performed five, ten, fifteen, twenty, and twenty five times, respectively, to obtain a catalyst for a fuel cell.

Evaluation Example 1

Figure 5:
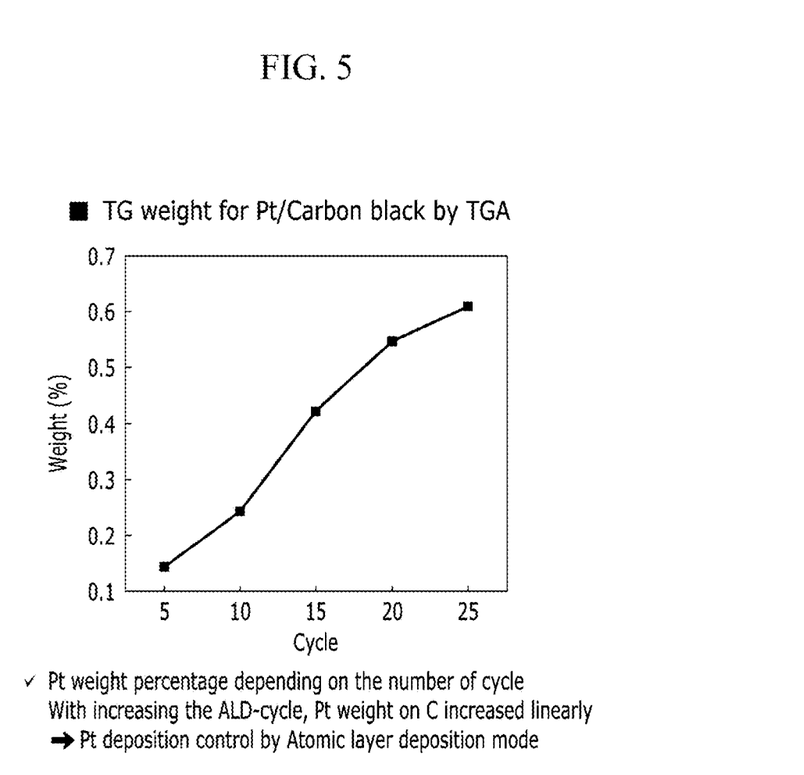
FIG. 5 is a graph showing the Pt content of the catalyst according to the ALD cycle of the catalyst prepared according to an embodiment of the present disclosure.

FIG. 5 is a Pt content of the Pt/C catalyst prepared according to the example was measured by TGA (Thermogravimetric Analysis) according to the ALD cycle.

In FIG. 5, it can be seen that the Pt content which is almost directly proportional to the number of cycles. That is, according to one embodiment of the present disclosure, it can be seen that the Pt content deposited on the carbon black can be controlled as desired.

Evaluation Example 2

Figure 6:
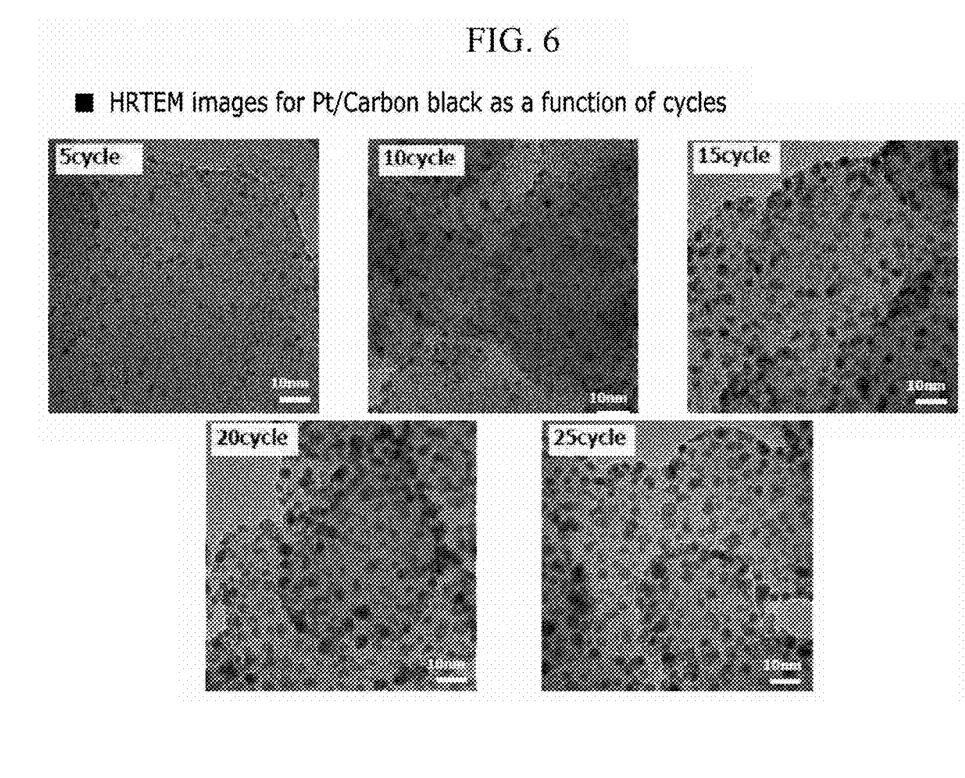
FIG. 6 is an high-resolution transmission electron microscopy (HRTEM) photograph of a catalyst prepared according to one embodiment of the present disclosure.

FIG. 6 is an HRTEM photograph of a Pt/C catalyst prepared according to the embodiment.

Referring to FIG. 6, it can be seen that the Pt spot increases as the number of cycles increases.

In general, it can be seen that platinum spots of 1 to 5 nm size are almost uniformly attached to carbon black. Specifically, when the same cycle is performed, the grown platinum spots are almost the same size and exhibit a uniform distribution as a whole. It can be seen that if the number of cycles is small, a small amount of platinum can be used to maximize the surface area.

Evaluation Example 3

Figure 7:
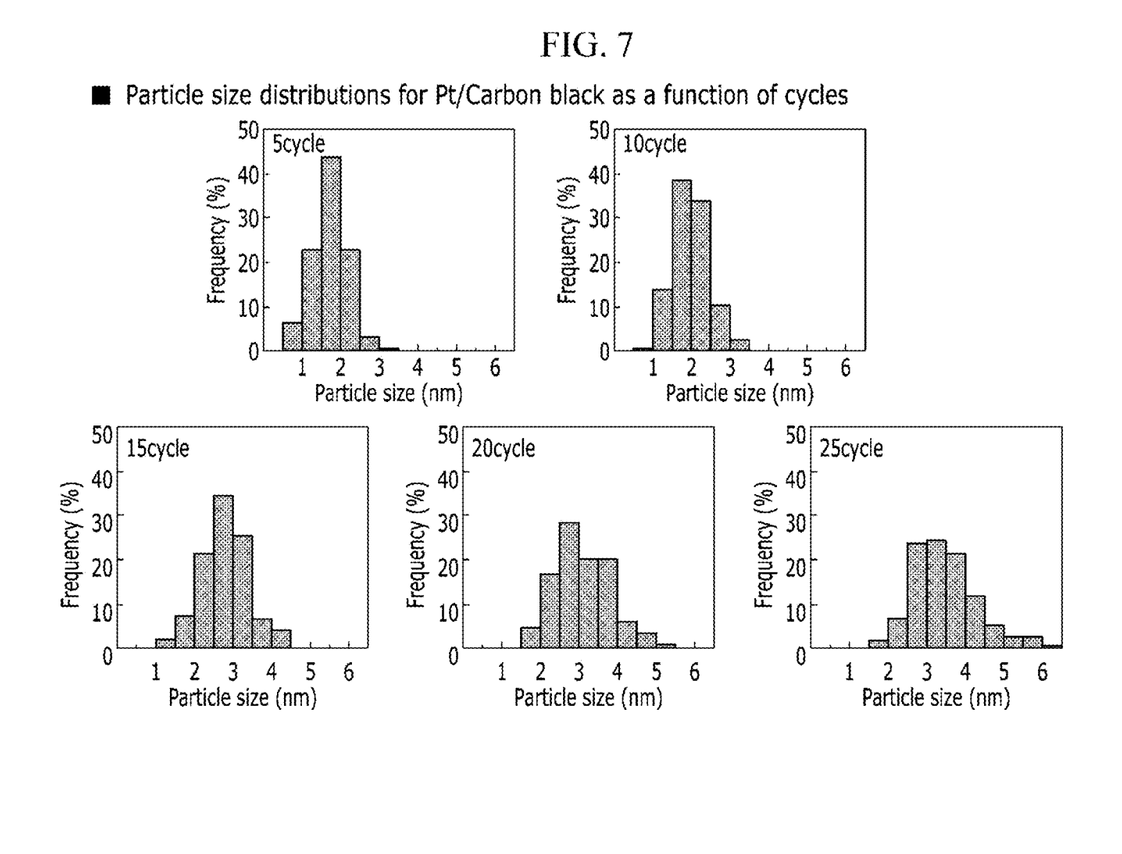
FIG. 7 is a Gaussian distribution of the Pt spot size according to the ALD cycle of a catalyst prepared according to one embodiment of the present disclosure.

FIG. 7 shows that the Pt spot size distribution of the Pt/C catalyst prepared according to the example was counted according to the ALD cycle. As the overall Gaussian distribution shows, the spot size increases as the number of cycle increases.

Evaluation Example 4

Figure 8:
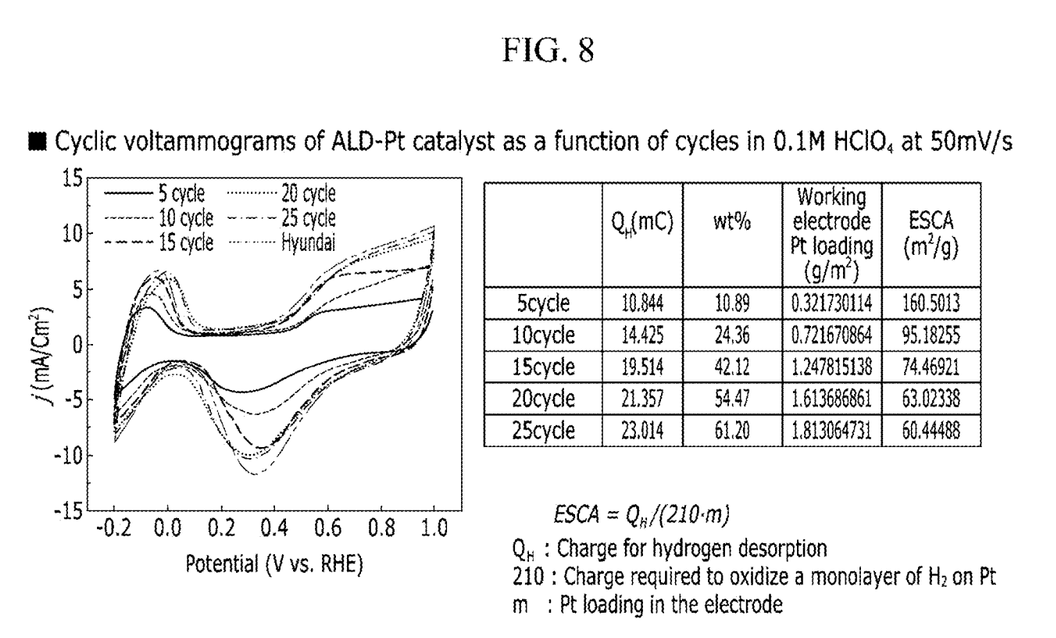
FIG. 8 is a cyclic voltammetry graph a Pt/C catalyst prepared according to an embodiment of the present disclosure on an electrode.

FIG. 8 shows that a Pt/C catalyst prepared according to the present disclosure was placed on an electrode and subjected to cyclic voltammetry. In addition, QH, the mass % of the platinum catalyst, the platinum loading amount of the working electrode, and the electrochemical active surface area (ESCA) calculated through the values obtained by the cyclic voltammetry were shown.

When the Pt/C catalyst was measured on the electrode, the same catalyst weight was loaded. Therefore, the amount of Pt in the Pt/C catalyst on the electrode was measured differently according to the process cycle.

According to this, although there is no significant difference in the current density for each cycle, the charge amount $Q_H$ required to desorb hydrogen is smaller as the number of cycles is smaller.

The electrochemical active surface area (Pt) shows that the smaller the number of cycles, the larger the same by the calculation.

According to the above observations, it is concluded that Pt/C catalysts by fluidized bed ALD can obtain efficient catalysts with high active surface area as the ALD cycle is minimized. These conclusions indicate that high efficiency control and production of Pt/C catalysts by fluidized bed ALD means high productivity, resulting in excellent mass applicability.

The present disclosure is not limited to the above embodiments, but may be manufactured in various forms, and a person skilled in the art to which the present disclosure pertains has another specific form without changing the technical spirit or essential features of the present disclosure. It will be appreciated that the present disclosure may be practiced as. Therefore, it should be understood that the embodiments described above are exemplary in all respects and not restrictive.

DESCRIPTION OF SYMBOL

100: fluidized bed reactor
101: upper mesh
102: lower mesh
103: upper glass bead
104: lower glass bead
105: upper surface mesh
200: vacuum pump
300: container
400: purge gas reservoir
500: reaction gas reservoir
600: first pipe
700: second pipe
800: third pipe

The invention claimed is:

1. A method for producing a catalyst for a fuel cell comprising:
   a) injecting carbon particles into a fluidized bed reactor;
   b) evacuating the fluidized bed reactor to form a base pressure;
   c) introducing a catalytic platinum precursor together with a carrier gas into the fluidized bed reactor to contact the catalytic platinum precursor with the carbon particles;
   d) purging a purge gas into the fluidized bed reactor;
   e) introducing a reaction gas into the fluidized bed reactor to attach the catalytic platinum precursor to the carbon particles; and
   f) purging a purge gas into the fluidized bed reactor,
   wherein, a catalytic platinum having a nano-sized diameter is attached to the carbon particles,
   the catalyst includes a carbon particle and the catalytic platinum,
   a diameter of the catalytic platinum is 1 to 5 nm,
   the step c) is performed for 90 to 150 seconds,
   the step d) is performed for 60 to 120 seconds,
   the step e) is performed for 60 to 120 seconds,
   the step (f) is performed for 60 to 120 seconds,
   an internal pressure of the fluidized bed reactor of steps c) to f) is 1 to 5 Torr,
   the purge gas inflow rate is 50 to 200 standard cubic centimeter per minute (sccm), and
   a flow rate of the reaction gas is 10 to 200 sccm.

2. The method of claim 1,
   further comprising repeating the steps c) to f) plural times to increase the diameter of the catalytic platinum adhered to the carbon particles.

3. The method of claim 1,
   wherein, the method further comprises a step of applying vibration to the fluidized bed reactor at 10 to 500 Hz to remove an adhesion material in a mesh located at an outlet of the fluidized bed reactor in the steps c) to f).

4. The method of claim 1,
   wherein, in the step of evacuating the fluidized bed reactor to form a base pressure, the pressure is 0.1 to 0.5 Torr.

5. The method of claim 1,
   wherein an inner temperature of the fluidized bed reactor in steps c) to f) is 200 to 400° C.

6. The method of claim 1,
   wherein the catalytic platinum precursor further comprises a metal selected from the group consisting of, Co, Ru, Pd, Cu, Ni, Ag, Ir, Mo, Fe, W, Au, Rh, and combinations thereof.

7. The method of claim 6,
   wherein the precursor including Pt comprises one selected from the group consisting of trimethyl(methacyclopentadienyl)platinum(MeCpPtMe$_3$), Platinum(II) acetylacetonate(Pt(acac)$_2$), [(1,2,5,6.η).1,5.hexadiene] dimethylplatinum(II)(HDMP), dimethyl(N,N-dimethyl-3-butene-1-amine-N)platinum(DDAP), and combinations thereof,
   wherein, the precursor including Co comprises one selected from the group consisting of Bis(N,N'-di-i-propylacetamidinato)cobalt(II)(Co(iPrNCMeNiPr)$_2$), Bis(cyclopentadienyl)cobalt(II)(CoCp$_2$), Cyclopentadienylcobalt dicarbonyl(CoCp(CO)$_2$), Cobalt carbonyl (Dicobalt octacarbonyl) (Co$_2$(CO)$_8$), and combinations thereof, wherein, the precursor including Ru comprises one selected from the group consisting of Bis(cyclopentadienyl)ruthenium(Ru(Cp)$_2$), Bis(ethylcyclopentadienyl)ruthenium(II)(Ru(EtCp)$_2$), methylcyclopentadienyl ethylcyclopentadienyl ruthenium ((EtCp)Ru(MeCp)), (Me$_3$NEtCp)RuCp, Cyclopentadienyl ethyl (dicarbonyl) Ruthenium(Ru(Cp)(CO)$_2$Et), N,N-Dimethyl-1-ruthenocenylethylamine (RuCp(CpCh(Me)(NMe$_2$))), Tris(2,2,6,6-tetramethyl-3,5-heptanedionato) ruthenium(III)(Ru(thd)$_3$), Bis(N,N-di-t-butylacetamidinato)ruthenium(II) dicarbonyl(Ru(tBuAMD)$_2$(CO)$_2$), Rudic, Carish, and combinations thereof, wherein, the precursor including Pd comprises one selected from the group consisting of Palladium(II) hexafluoroacetylacetonate(Pd(hfac)$_2$), Palladium tetramethylheptanedionate(Pd(thd)$_2$), palladium-ketoiminato(Pd(keim$_2$)$_2$), and combinations thereof, wherein, the precursor including Cu comprises one selected from the group consisting of Copper(I) chloride(CuCl), Copper(II) hexafluoroacetylacetonate hydrate(Cu(hfac)$_2$), Copper(II) acetylacetonate(Cu(acac)$_2$), Copper bis(2,2,6,6-tetramethyl-3,5-heptanedionate)(Cu(thd)$_2$), Bis(dimethylamino-2-propoxy)copper(II)(Cu(dmap)$_2$), Bis(N,N'-di-i-propylacetamidinato)copper(II)([Cu(iPrNCMeNiPr)]$_2$), Bis(N,N'-di-sec-butylacetamidinato)dicopper(I)([Cu(sBuNCMeNsBu)]$_2$), and combinations thereof, wherein, the precursor including Ni comprises one selected from the group consisting of Bis(N,N'-di-i-propylacetamidinato)nickel(II)(Ni(iPrNCMeNiPr)$_2$), Nickel(II) acetylacetonate(Ni(acac)$_2$), Nickel Heptafluoroisopropyl(Ni(hfip)$_2$), and combinations thereof, wherein, the precursor including Ag comprises one selected from the group consisting of (2,2-dimethylpropionato)silver(I)triethylphosphine(Ag(O$_2$CtBu)(PEt$_3$)), (1,5-Cyclooctadiene)(hexafluoroacetylacetonato)silver(I)(Ag(hfac)(cod)), and combinations thereof, wherein, the precursor including Ir comprises one selected from the group consisting of Iridium(III) acetylacetonate(Ir(acac)$_3$), iridium(ethylcyclopentadienyl)(1,5-cyclooctadiene)(Ir(EtCp)(cod)), 1-Ethylcyclopentadienyl-1,3-cyclohexadieneiridium(I)(Ir(MeCp)(chd)), and combinations thereof, wherein, the precursor including Mo comprises MoCl$_5$, wherein, the precursor including Fe comprises Bis(N,N'-di-sec-butylacetamidinato)iron(I)(Fe(iBuNCMeNtBu)$_2$), and wherein, the precursor including W comprises WF$_6$.

8. The method of claim 1,
wherein, the carbon particles comprise one selected from the group consisting of carbon black, graphene, CNTs, and combinations thereof.

9. The method of claim 1,
wherein, the reaction gas comprises one selected from the group consisting of O$_2$, O$_3$, Air, H$_2$, NH$_3$, H$_2$ plasma, NH$_3$ plasma, and O$_2$ plasma.

10. The method of claim 1,
wherein, the purge gas comprises argon gas, helium gas or nitrogen gas.

11. The method of claim 1,
before a) the step of injecting carbon particles into the fluidized bed reactor,
the method further comprises a step of filling glass beads into an interior part of a mesh located at an outlet of the fluidized bed reactor and an outer part of a mesh located at the inlet of the fluidized bed reactor.

12. The method of claim 1,
wherein, the purge gas comprises argon gas,
wherein, the reaction gas comprises an oxygen gas,
wherein, the carbon particles comprise carbon black, and
wherein, the platinum catalytic precursor comprises trimethyl(methacyclopentadienyl)platinum (MeCpPtMe$_3$).

13. The method of claim 1, wherein the purge gas inflow rate is 60 to 120 sccm.

14. The method of claim 1, wherein the catalytic platinum precursor comprises trimethyl(methacyclopentadienyl)platinum(MeCpPtMe$_3$).

* * * * *